(12) United States Patent
Redekopp

(10) Patent No.: US 8,407,639 B2
(45) Date of Patent: Mar. 26, 2013

(54) SYSTEMS AND METHODS FOR MAPPING STATE ELEMENTS OF DIGITAL CIRCUITS FOR EQUIVALENCE VERIFICATION

(75) Inventor: Mark W. Redekopp, Los Angeles, CA (US)

(73) Assignee: Raytheon Company, Waltham, MA (US)

( * ) Notice: Subject to any disclaimer, the term of this patent is extended or adjusted under 35 U.S.C. 154(b) by 122 days.

(21) Appl. No.: 13/015,504

(22) Filed: Jan. 27, 2011

(65) Prior Publication Data
US 2012/0198402 A1 Aug. 2, 2012

(51) Int. Cl.
*G06F 9/455* (2006.01)
(52) U.S. Cl. .................................. 716/107; 716/106
(58) Field of Classification Search .................. 716/106, 716/107
See application file for complete search history.

(56) References Cited

U.S. PATENT DOCUMENTS

| | | | |
|---|---|---|---|
| 6,247,163 B1 | 6/2001 | Burch et al. | |
| 6,496,955 B1 | 12/2002 | Chandra et al. | |
| 7,032,192 B2 | 4/2006 | Prasad et al. | |
| 7,149,675 B2 | 12/2006 | Hoskote et al. | |
| 8,015,520 B2 * | 9/2011 | McElvain et al. | 716/107 |
| 2002/0144215 A1 * | 10/2002 | Hoskote et al. | 716/3 |
| 2007/0011648 A1 * | 1/2007 | Abrams | 716/21 |

OTHER PUBLICATIONS

Extended European Search Report for European Application No. 11189916.7, Extended European Search Report dated Apr. 25, 2012 and mailed May 4, 2012 (6 pgs.).
Anastasakis, et al., "A Practical and Efficient Method for Compare-Point Matching", Synopsys Inc., DAC 2002, Jun. 10-14, 2002, New Orleans, Louisiana, USA, ACM 1-58113-461-4/02/0006 (6 pgs.).

* cited by examiner

*Primary Examiner* — Thuan Do
*Assistant Examiner* — Mohammed Alam
(74) *Attorney, Agent, or Firm* — Christie, Parker & Hale, LLP

(57) ABSTRACT

Systems and methods for mapping state elements of digital circuits for equivalence verification are provided. One method for mapping state elements for equivalence verification between a first circuit and a second circuit includes (a) determining a first sequential depth from primary inputs and primary outputs of the first circuit and the second circuit to each state element thereof, wherein the first sequential depth is a minimum count of state elements along any path between two points of a circuit, (b) identifying and mapping first state elements of the first circuit and the second circuit having a unique first sequential depth, (c) determining a second sequential depth from the identified first state elements of the first circuit and the second circuit to the remaining state elements, (d) identifying second state elements of the first circuit and the second circuit having a unique second sequential depth, and (e) repeating (c) and (d) unless the process is no longer generating new unique mappings of state elements.

19 Claims, 8 Drawing Sheets

| GROUP ID | GROUP MEMBERS | FEATURE VECTOR |
|---|---|---|
| 0 | i0 | 1,-,4,4 |
| 1 | i1 | -,1,4,4 |
| 2 | i2,i3 | 2,2,3,3 |
| 3 | i4,i5 | 1,1,3,3 |
| 4 | i6 | 3,3,2,2 |
| 5 | i7 | 2,2,2,2 |
| 6 | i8 | 3,3,1,- |
| 7 | i9 | 3,3,-,1 |

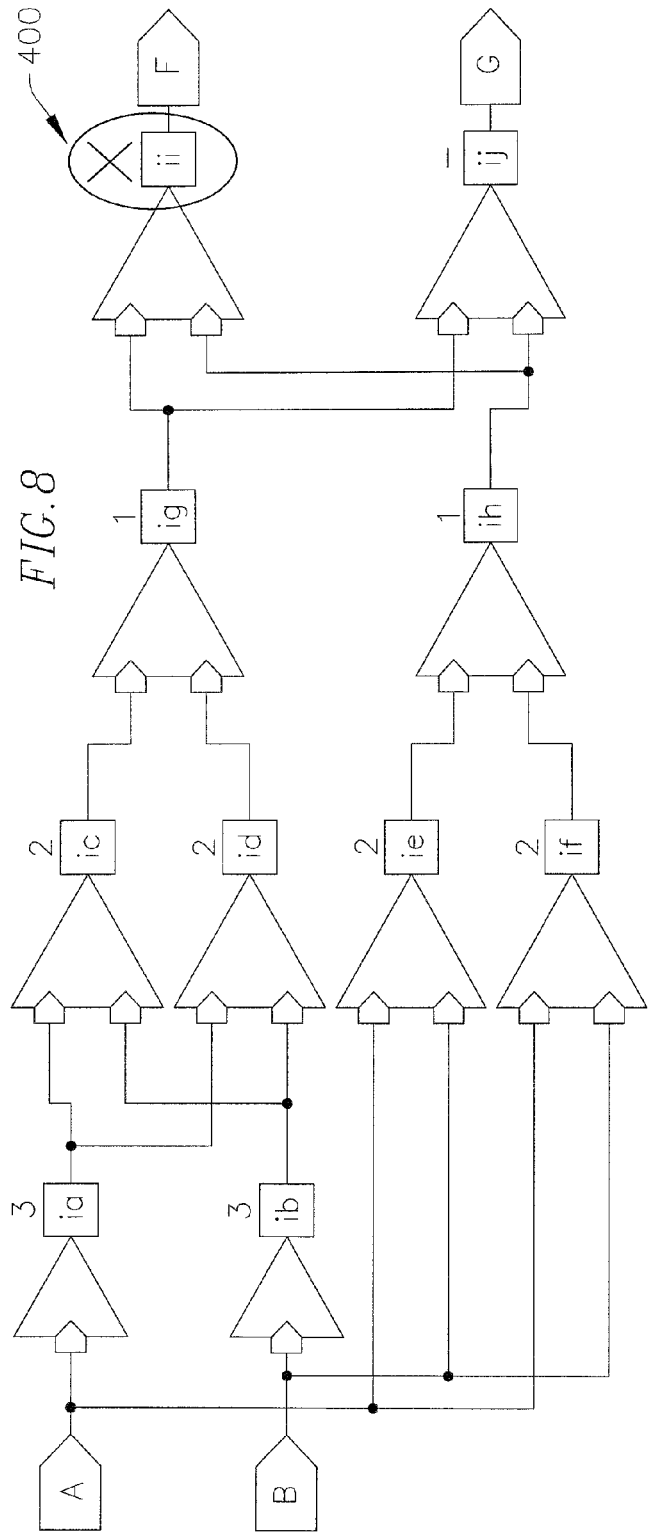

SYSTEMS AND METHODS FOR MAPPING STATE ELEMENTS OF DIGITAL CIRCUITS FOR EQUIVALENCE VERIFICATION

STATEMENT REGARDING FEDERALLY SPONSORED RESEARCH

This invention disclosure is related to Government contract number HR0011-08-C-0005 awarded by DARPA. The U.S. Government has certain rights in this invention.

FIELD

The present invention relates to equivalence verification, and more specifically to systems and methods for mapping state elements of digital circuits for equivalence verification.

BACKGROUND

The processes associated with integrated circuit design generally involve several design transformations from high levels of abstraction to intermediate and lower levels of abstraction. At each level, equivalence verification is performed to prove that any transformation has not functionally or logically altered the design.

Conventional equivalence verification methods generally require a mapping of state elements between the implementations to be verified as equivalent. These mapping methods fall into one of several categories. A naming method, which is fairly common, maps corresponding points in each design that are named similarly. However, the names of state elements may be altered or lost during a design transformation performed by some design tools using the naming method. In addition, the naming method can be fairly unusable for a reverse engineering type application. Another approach is a functional method that makes use of a canonical representation of a state element's fan-in logic cone (e.g., binary decision diagrams or BDDs). However, the functional method can often require that all of the inputs of a cone be mapped when that information might not be available, thereby creating a circular problem.

Another approach is a simulation method that simulates both design levels and then matches or narrows the selection of simulation components to state elements with similar value vectors. The simulation method can however be difficult to use in the presence of intentional or unintentional modifications. In another approach referred to as a structural method, a net-list to net-list type comparison is performed that examines combinational cone structure. In some instances, a combination of these approaches is used. However, many or all of the conventional approaches to equivalence verification have some shortfalls. Accordingly, an improved method for performing equivalence verification is needed.

SUMMARY

Aspects of the invention relate to systems and methods for mapping state elements of digital circuits for equivalence verification. In one embodiment, the invention relates to a method for mapping state elements for equivalence verification between a first circuit and a second circuit, the method including (a) determining a first sequential depth from primary inputs and primary outputs of the first circuit and the second circuit to each state element of the first and second circuits, wherein the first sequential depth is a minimum count of state elements along any path between two points of a circuit, (b) identifying and mapping first state elements of the first circuit and the second circuit having a unique first sequential depth, (c) determining a second sequential depth from the identified first state elements for the first circuit and the second circuit to the remaining state elements, (d) identifying second state elements of the first circuit and the second circuit having a unique second sequential depth, and (e) repeating (c) and (d) unless the process is no longer generating new unique mappings of state elements.

In another embodiment, the invention relates to a method for mapping state elements for equivalence verification between a first circuit and a second circuit, the method including (a) determining a first sequential depth from primary inputs and primary outputs of the first circuit and the second circuit to each state element of the first and second circuits, wherein the first sequential depth is a minimum count of state elements along any path between two points of a circuit, (b) generating a first feature vector for each state element of the first circuit and the second circuit based on the first sequential depth for the each state element, (c) identifying state elements of the first circuit and the second circuit having unique first vectors, and mapping the identified state elements of the first circuit to the identified state elements of the second circuit if the first feature vectors of the identified state elements of the first and second circuits are about identical, (d) determining a second sequential depth from the identified first state elements for the first circuit and the second circuit to the remaining state elements, (e) generating a second feature vector for each identified state element of the first circuit and the second circuit based on the second sequential depth for the each identified state element, (f) identifying state elements of the first circuit and the second circuit having unique second vectors, and mapping the identified state elements of the first circuit having unique second vectors to the identified state elements of the second circuit having unique second vectors if the second feature vectors of the identified state elements of the first and second circuits having unique second vectors are about identical, and (g) determining whether a threshold condition for completion of the mapping process is satisfied.

BRIEF DESCRIPTION OF THE DRAWINGS

FIG. 8 is a schematic diagram of the digital circuit of FIG. 3 after a design tool has performed a modification where a state element is optimized away illustrating the effect on the sequential depth in accordance with one embodiment of the invention.

FIG. 9 is a reproduction of the table of FIG. 7 for illustrating minor differences in the respective feature vectors caused by the state element removal illustrated in FIG. 8 in accordance with one embodiment of the invention.

FIG. 10 is a table illustrating the minor differences in the respective feature vectors caused by the state element removal illustrated in FIG. 8 in accordance with one embodiment of the invention.

DETAILED DESCRIPTION

Figure 1:
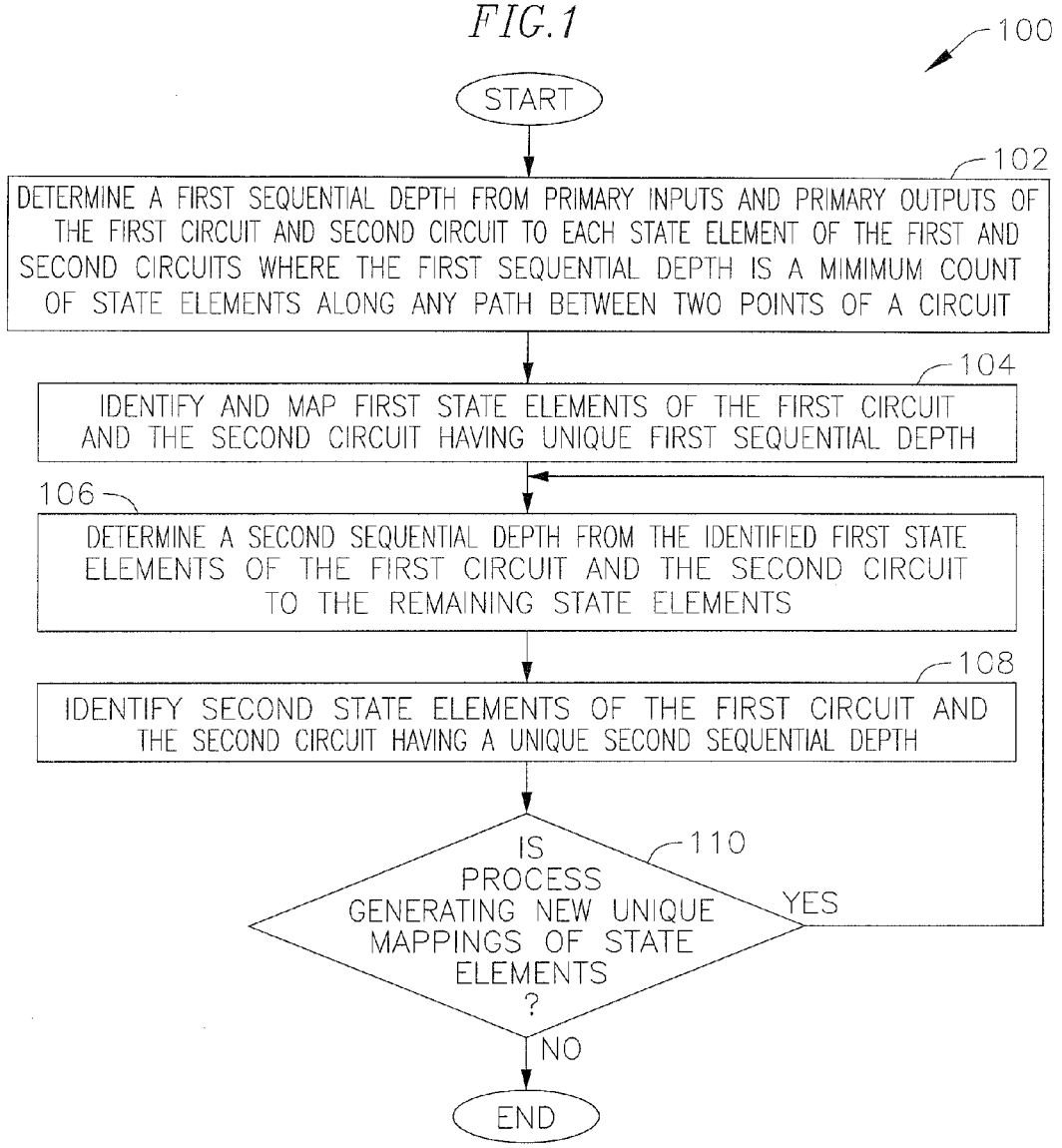
FIG. 1 is a flow chart of a process for mapping state elements for equivalence verification between a first circuit and a second circuit in accordance with one embodiment of the invention.

Referring now to the drawings, embodiments of systems and methods for mapping state elements for equivalence verification between a first circuit and a second circuit are illustrated. These methods can include determining a sequential depth from primary inputs and outputs to each state element of each circuit, where the sequential depth is a count of the minimum number of state elements encountered along all possible paths between two points of a circuit. The methods can also include identifying and mapping state elements of the first circuit and the second circuit having a unique sequential depth from the primary inputs and outputs. In several embodiments, the methods map the uniquely identified state elements of the first circuit to corresponding uniquely identified state elements in the second circuit. The methods can then include determining a second sequential depth from the identified first state elements for the first circuit and the second circuit to the remaining state elements, and identifying and mapping second state elements of the first circuit and the second circuit having a unique second sequential depth. In several embodiments, the actions of the previous sentence are repeated until the method is no longer generating new unique mappings for state elements.

In several embodiments, the sequential depth methods provide improved performance for equivalence verification and can be used in conjunction with other equivalence verification systems for optimal performance. In one embodiment, the sequential depth methods can be used as a starting point for a conventional equivalence verification tool. In such case, the sequential depths methods can significantly improve the performance of the conventional equivalence verification tool. In several embodiments, sequential depths methods described herein are used in conjunction with one of the conventional equivalence verification tools, such as a functional tool, a simulation tool, a naming tool, or other suitable verification tool.

FIG. 1 is a flow chart of a process 100 for mapping state elements for equivalence verification between a first circuit and a second circuit in accordance with one embodiment of the invention. In block 102, the process first determines a first sequential depth from primary inputs and primary outputs of the first circuit and the second circuit to each state element of the first and second circuits, where the first sequential depth is a minimum count of state elements along any path between two points of a circuit. In several embodiments, the first sequential depth is a count of the minimum number of state elements encountered between one of the primary inputs or outputs and a particular state element along any path. In a number of embodiments, the process determines the first sequential depth from each of the state elements of the first circuit to each of the primary inputs and primary outputs of the first circuit, and determines the first sequential depth from each of the state elements of the second circuit to each of the primary inputs and primary outputs of the second circuit.

In block 104, the process identifies first state elements of the first circuit and the second circuit having a unique first sequential depth. In several embodiments, the process groups the first state elements having about identical first sequential depth in order to identify the non-identical or unique first state elements. The unique sequential depth counts or signatures provide an opportunity to map state elements between the first and second circuits. In one embodiment, the process, in identifying the first state elements, groups state elements of the first circuit having about identical first sequential depth, selects the first state elements of the first circuit having a group count of one, groups state elements of the second circuit having about identical first sequential depth, and selects the first state elements of the second circuit having a group count of one. A group count of one can correspond to a state element that has a unique sequential depth.

In block 106, the process determines a second sequential depth from the identified first state elements of the first circuit and the second circuit to the remaining state elements. In several embodiments, the remaining state elements are the state elements that have not previously been identified and mapped with unique first sequential depth. In several embodiments, the second sequential depth is a count of the state elements between one of the identified first state elements and a particular state element. In one embodiment, the process, in determining the second sequential depth, determines the second sequential depth to each of the state elements of the first circuit from each of the identified first state elements of the first circuit, and determines the second sequential depth to each of the state elements of the second circuit from each of the identified first state elements of the second circuit.

In block 108, the process identifies second state elements of the first circuit and the second circuit having a unique second sequential depth and maps them to corresponding components in the other circuit. In several embodiments, the process groups the second state elements having about identical sequential depth in order to identify the non-identical or unique second state elements. In one embodiment, the process, in identifying the second state elements, groups state elements of the first circuit having about identical second sequential depth, selects the second state elements of the first circuit having a group count of one, groups state elements of the second circuit having about identical second sequential depth, and selects the second state elements of the second circuit having a group count of one. The selected groups provide an opportunity to map state elements between the first and second circuits.

In block 110, the process determines whether the process is generating new mappings of state elements. If not, the process ends. If so, the process returns to block 106 and iteratively repeats the actions of blocks 106 and 108 until the condition of block 110 is satisfied. In one embodiment, the process repeats the actions of blocks 106 and 108 until successive iterations of blocks 106 and 108 do not generate new unique mappings of state elements In several embodiments, process 100 is performed using a computer. In one embodiment, the process can perform the sequence of actions in a different order. In another embodiment, the process can skip one or more of the actions. In other embodiments, one or more of the actions are performed simultaneously. In some embodiments, additional actions can be performed.

Figure 2:
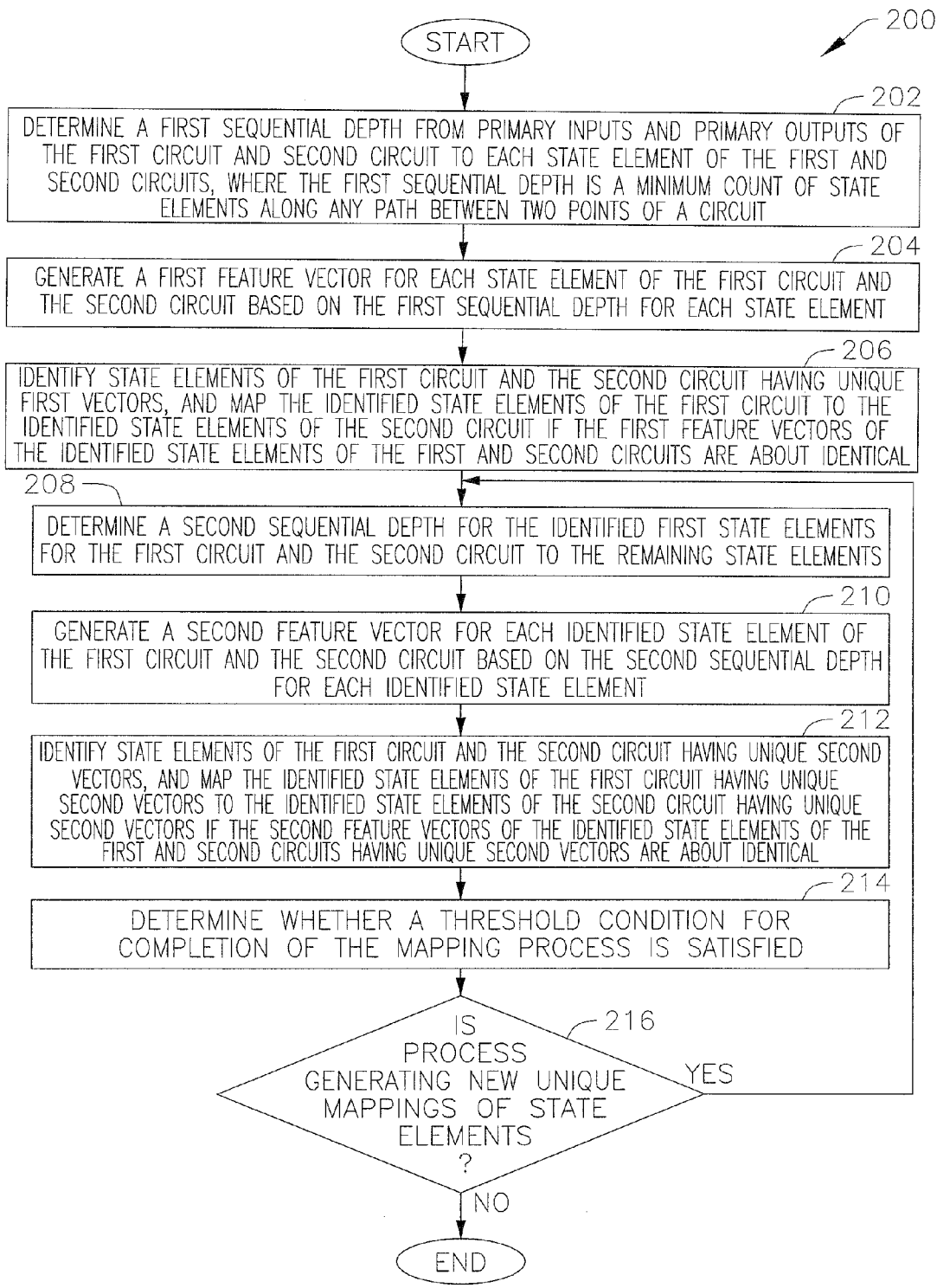
FIG. 2 is a flow chart of another process for mapping state elements for equivalence verification between a first circuit and a second circuit in accordance with one embodiment of the invention.

FIG. 2 is a flow chart of another process 200 for mapping state elements for equivalence verification between a first circuit and a second circuit in accordance with one embodiment of the invention. In block 202, the process first determines a first sequential depth from primary inputs and primary outputs of the first circuit and the second circuit to each state element of the first and second circuits, where the first sequential depth is a minimum count of state elements along any path between two points of a circuit. In several embodiments, the first sequential depth is a count of the minimum number of state elements encountered between one of the primary inputs or outputs and a particular state element along any path. In one embodiment, the process, in determining the first sequential depth, determines the first sequential depth to each of the state elements of the first circuit from each of the primary inputs and primary outputs of the first circuit, and determines the first sequential depth to each of the state elements of the second circuit from each of the primary inputs and primary outputs of the second circuit.

In block 204, the process generates a first feature vector for each state element of the first circuit and the second circuit based on the first sequential depth for each state element. In several embodiments, the feature vector consists of sequential depth measurements to a respective state element from each primary input and each primary output.

In block 206, the process identifies first state elements of the first circuit and the second circuit having unique first vectors, and maps the identified state elements of the first circuit to the identified state elements of the second circuit if the first feature vectors of the identified state elements of the first and second circuits are about identical. In several embodiments, the process groups the first vectors having about identical sequential depth vectors in order to identify the non-identical or unique first vectors. In one embodiment, the process, in identifying the first state elements, groups state elements of the first circuit having about identical first vectors, selects the first state elements of the first circuit having a group count of one, groups state elements of the second circuit having about identical first vectors, and selects the first state elements of the second circuit having a group count of one. A group count of one can correspond to a state element that has a unique sequential depth.

In one embodiment, one feature vector is about identical to another feature vector when the feature vectors differ by a single digit. In another embodiment, one feature vector is about identical to another feature vector when the feature vectors differ by a preselected percentage. In another embodiment, one feature vector is about identical to another feature vector when the feature vectors differ by a preselected threshold deemed acceptable by a preselected distance algorithm. Distance metrics or distance algorithms for mapping state elements despite minor differences are discussed in further detail below.

In block 208, the process determines a second sequential depth from the identified first state elements for the first circuit and the second circuit to the remaining state elements. In several embodiments, the remaining state elements are the state elements that have not previously been identified with unique first sequential depth. In one embodiment, the process, in determining the second sequential depth, determines the second sequential depth to each of the state elements of the first circuit from each of the identified state elements of the first circuit, and determines the second sequential depth to each of the state elements of the second circuit from each of the identified state elements of the second circuit.

In block 210, the process generates a second feature vector for each identified state element of the first circuit and the second circuit based on the second sequential depth for each state element. In several embodiments, each second feature vector consists of sequential depth measurements to a respective state element from the identified state elements.

In block 212, the process identifies second state elements of the first circuit and the second circuit having unique second vectors, and maps the identified state elements of the first circuit having unique second vectors to the identified state elements of the second circuit having unique second vectors if the second feature vectors of the identified state elements of the first and second circuits having unique second vectors are about identical. In several embodiments, the process groups the second vectors having about identical sequential depth in order to identify the non-identical or unique second vectors. In one embodiment, the process, in identifying the second state elements, groups state elements of the first circuit having about identical second vectors, selects the second state elements of the first circuit having a group count of one, groups state elements of the second circuit having about identical second vectors, and selects the second state elements of the second circuit having a group count of one.

In block 216, the process determines whether the process is generating new unique mappings of state elements. If not, the process ends. If so, the process returns to block 208 and iteratively repeats the actions of blocks 208 to 214 until the condition of block 216 is satisfied. In several embodiments, the condition of block 216 is satisfied when successive iterations of the actions of blocks 208 to 214 do not generate any new unique mappings of state elements.

In one embodiment, the process can perform the sequence of actions in a different order. In another embodiment, the process can skip one or more of the actions. In other embodiments, one or more of the actions are performed simultaneously. In some embodiments, additional actions can be performed.

In some embodiments, characteristics other than sequential depth capable of differentiating between flops are also used. In one such embodiment, one or more of the other characteristics is added to the feature vectors as an additional differentiator.

Figure 3:
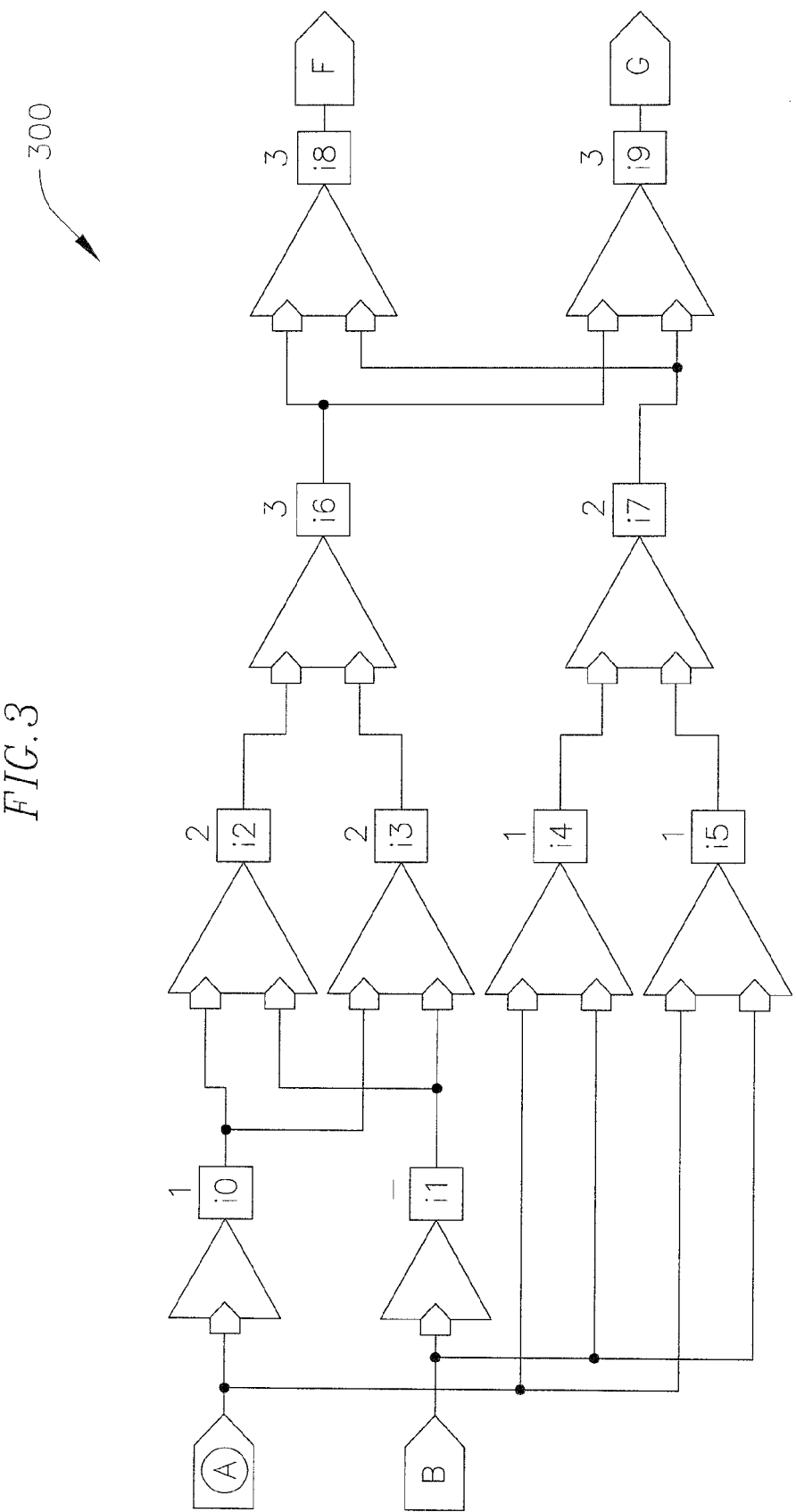
FIG. 3 is a schematic diagram of a digital circuit illustrating a determination of sequential depth from a primary input to each state element of the digital circuit in accordance with one embodiment of the invention.

FIG. 3 is a schematic diagram of a digital circuit 300 illustrating a determination of sequential depth from a primary input A to each state element of the digital circuit in accordance with one embodiment of the invention. In particular embodiments, this determination of sequential depth from a primary input can be used in conjunction with blocks 102 and 202 of the processes of FIGS. 1 and 2.

The circuit 300 includes primary input A, primary input B, primary output F, primary output G, and state elements i0, i1, i2, i3, i4, i5, i6, i7, i8, i9. The sequential depth (e.g., minimum count of state elements encountered along any path between two points) for each state element to primary input A has been determined and is displayed above each state element box in FIG. 3. For example, the sequential depth from state element i0 to primary input A is "1" since a minimum distance path to primary input A from i0 crosses one state element, namely i0. The sequential depth from state element i1 to primary input A is "–" for being unreachable, or stated differently, being at an infinite distance. The sequential depth from state element i9 to primary input A is "3" as the shortest path to primary input A crosses three state elements, namely i9, i7, and either i4 or i5. The sequential depths from the other state elements are determined in a similar manner.

The circuit of FIG. 3 is an example of one circuit that can be used with a sequential depth process. In other embodiments, the sequential depth processes can be used with other circuits. In other embodiments, for example, the sequential depth processes can be used with circuits having additional or fewer primary inputs and outputs and state elements than the circuit of FIG. 3.

Figure 4:
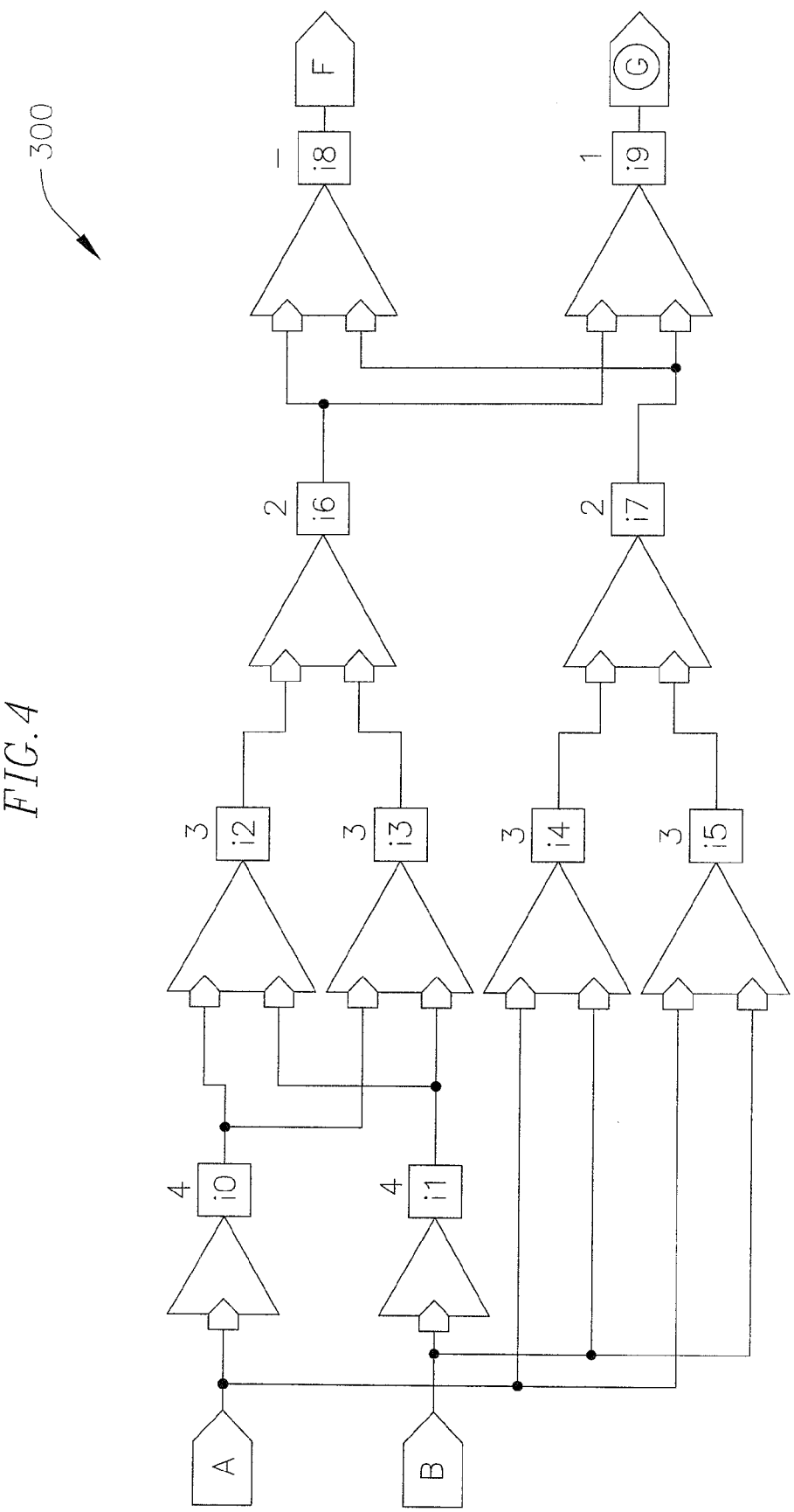
FIG. 4 is a schematic diagram of the digital circuit of FIG. 3 illustrating a determination of sequential depth from a primary output to each state element of the digital circuit in accordance with one embodiment of the invention.

FIG. 4 is a schematic diagram of the digital circuit 300 of FIG. 3 illustrating a determination of sequential depth from a primary output G to each state element of the digital circuit in accordance with one embodiment of the invention. The sequential depth for each state element to primary output G has been determined and listed above each state element box. For example, the sequential depth from state element i9 to primary input A is "1" since a minimum distance path to primary output G from i9 crosses one state element, namely i9. The sequential depth from state element i8 to primary output G is "–" as it is unreachable from i8. The sequential depth from state element i1 to primary output G is "4" as the shortest path crosses i1, either i2 or i3, i6, and i9. The sequential depths from the other state elements are determined in a similar manner.

Figure 5:
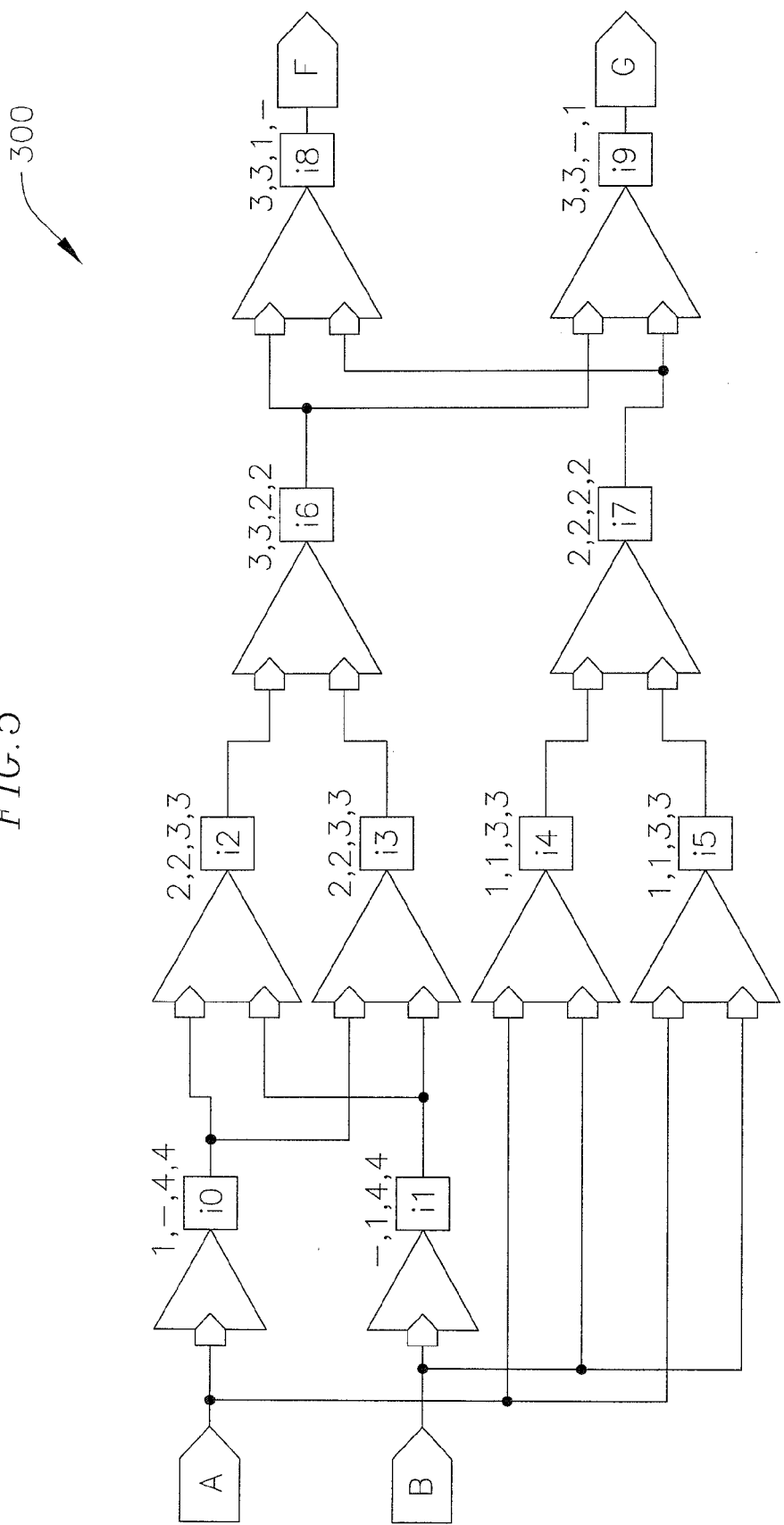
FIG. 5 is a schematic diagram of the digital circuit of FIG. 3 illustrating a determination of feature vectors consisting of the sequential depth from each of the primary inputs and primary outputs to each state element of the digital circuit in accordance with one embodiment of the invention.

FIG. 5 is a schematic diagram of the digital circuit 300 of FIG. 3 illustrating a determination of feature vectors consisting of the sequential depth from each of the primary inputs and primary outputs to each state element of the digital circuit 300 in accordance with one embodiment of the invention. The feature vectors at each state element reflect the sequential depth to the primary inputs and outputs in a vector order of A, B, F, G. For example, the sequential depth for the first digit of each feature vector reflects the sequential depth to primary input A with calculated numbers that are identical to those illustrated in FIG. 3. Similarly, the sequential depth for the last digit of each feature vector reflects the sequential depth from primary output G with calculated numbers that are identical to those illustrated in FIG. 4. In several embodiments, once the feature vectors are determined, a process can use them to identify and map state elements having unique feature vectors.

Figures 6, 7:
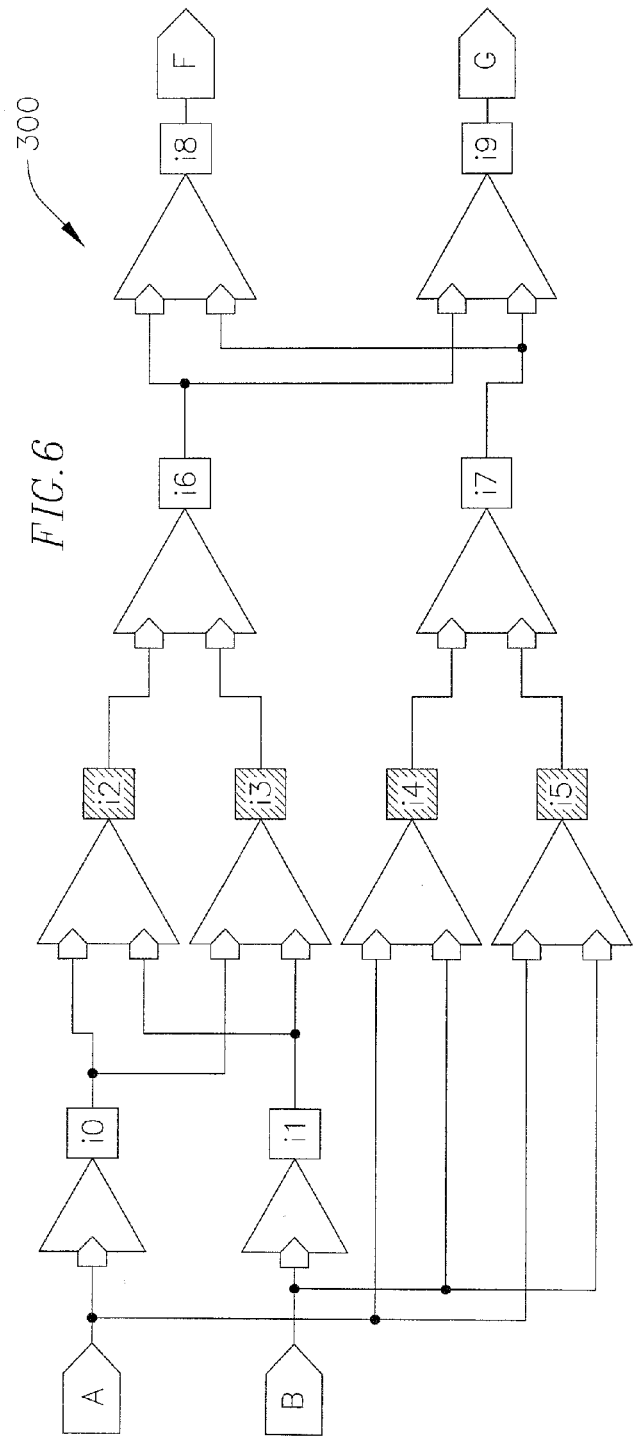
FIG. 6 is a schematic diagram of the digital circuit of FIG. 3 illustrating a grouping of state elements having identical feature vectors and an identification of state elements having unique feature vectors in accordance with one embodiment of the invention.
FIG. 7 is a table illustrating the grouping of state elements having identical feature vectors and the identification of state elements having unique feature vectors in FIG. 6 in accordance with one embodiment of the invention.

FIG. 6 is a schematic diagram of the digital circuit 300 of FIG. 3 illustrating a grouping of state elements having identical feature vectors (i2, i3, i4, i5) and an identification of state elements having unique feature vectors (i0, i1, i6, i7, i8, i9) in accordance with one embodiment of the invention.

FIG. 7 is a table illustrating the grouping of state elements having identical feature vectors and the identification of state elements having unique feature vectors in FIG. 6 in accordance with one embodiment of the invention. In the table, common feature vectors are grouped together and assigned a group identification number. As can be seen from the table and FIG. 6, the feature vectors for i2, i3 and i4, i5 are not unique while the remaining feature vectors are unique. In general, groups of size one (e.g., having unique sequential depth) can be mapped between circuits.

In accordance with several of the processes described herein, the feature vectors identified as being unique can be used for subsequent sequential depth determinations. In a number of embodiments, an iterative process continues to calculate sequential depth from previously mapped state elements to identify new state elements having unique vectors until successive iterations of the process do not generate new unique mappings of the state elements. In several embodiments, the digital circuits of FIGS. 3-6 and table of FIG. 7 are used in conjunction with one or more of the processes illustrated in FIGS. 1 and 2.

FIG. 8 is a schematic diagram of a digital circuit 400 based on the digital circuit of FIG. 3 after a design tool has performed a modification where a state element (ij) is optimized away illustrating the effect on the sequential depth in accordance with one embodiment of the invention. The sequential depth from primary output F is shown at each state element after state element (ij) is optimized away.

FIG. 9 is a reproduction of the table of FIG. 7 for illustrating minor differences in the respective feature vectors caused by the state element removal illustrated in FIG. 8 in accordance with one embodiment of the invention.

FIG. 10 is a table illustrating the minor differences in the respective feature vectors caused by the state element removal illustrated in FIG. 8 in accordance with one embodiment of the invention. As can be seen from the tables of FIGS. 9 and 10, the feature vectors are nearly identical except that the sequential depth related to primary output F in FIG. 10 (third digit of feature vectors) is effectively off by one as compared to corresponding state element groupings of FIG. 9. Due to intentional or unintentional synthesis differences between circuit implementations, corresponding state elements or flops across designs may have such minor differences in features vectors. In several embodiments, the processes described herein can use a distance metric or distance algorithm to map state elements despite these minor differences. For example, in one embodiment, the processes can use a Euclidean distance algorithm, a Manhattan distance algorithm, a Hamming distance algorithm or another suitable distance algorithm for grouping vectors having "minor distance" therebetween.

Figure 11:
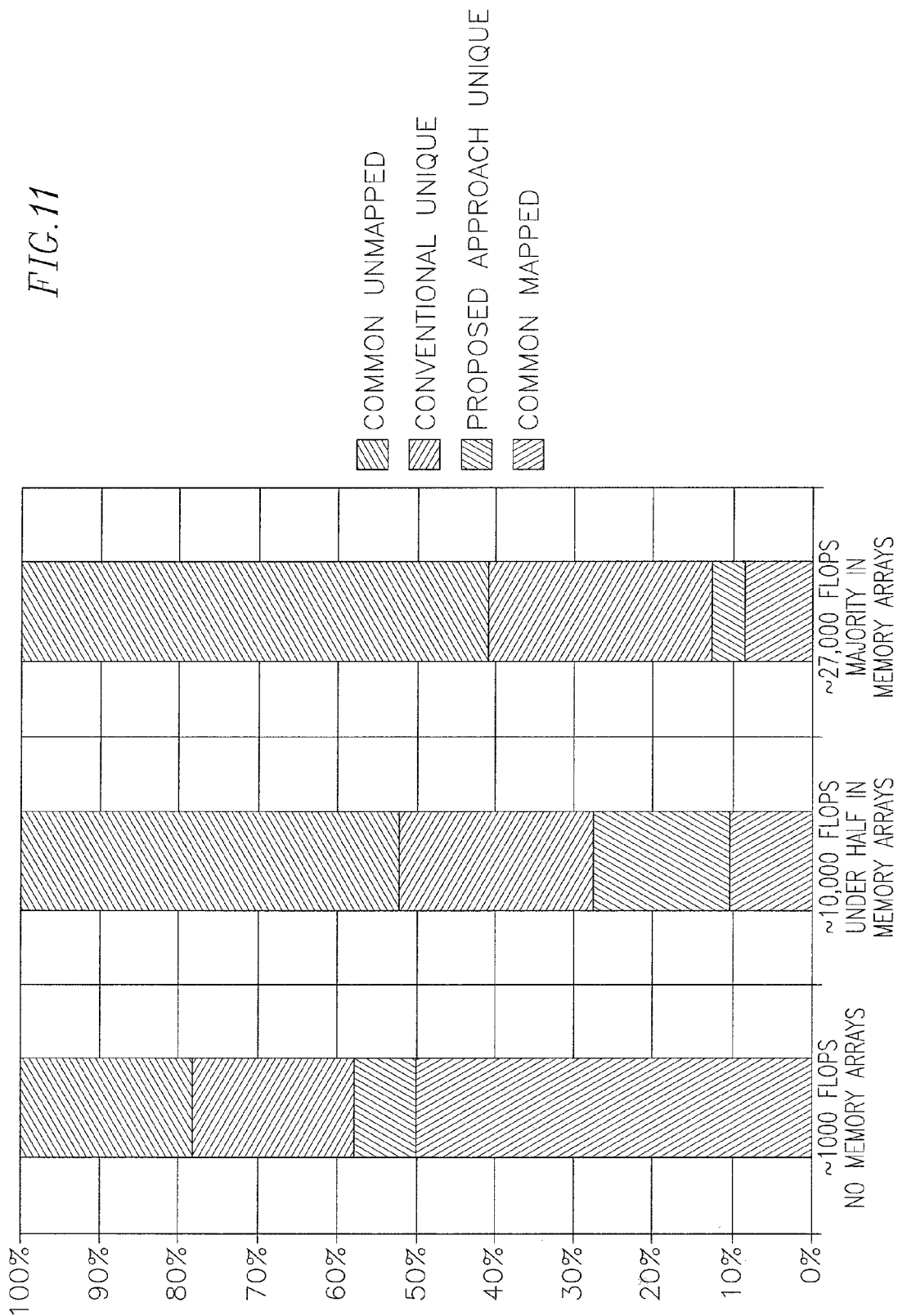
FIG. 11 is a graph illustrating improvements in mapping performance associated with a sequential depth mapping process and a comparison to a conventional mapping tool in accordance with one embodiment of the invention.

FIG. 11 is a graph illustrating improvements in mapping performance associated with a sequential depth mapping process and a comparison to a conventional mapping tool in accordance with one embodiment of the invention. In each column, the graph indicates the percentage of flops (e.g., state elements) that both the sequential depth and conventional processes mapped, the percentage of flops that only the sequential depth process mapped, the percentage of flops that only the conventional process mapped, and the percentage of flops that neither the sequential depth matching process nor the conventional mapping tool could map. Results for three different circuit designs are illustrated with one circuit design illustrated in each of the three columns. The first circuit design includes about 1000 flops that do not form memory arrays. The second design includes about 10,000 flops where under half of the flops are used in memory arrays. The third design includes about 27,000 flops where a majority of the flops are used in memory arrays. By using a sequential depth process in addition to one conventional process, up to 24 percent more flops can be mapped, thereby providing a better tool for comprehensive equivalence verification.

In general, the state elements of memory arrays can be hard to name when the mapping of address bits is unknown. In some cases, use of a functional tool is highly suited to a circuit including many memory arrays. In several embodiments, sequential depth mapping processes can however significantly aid the naming process for memory array components. In some cases, the sequential depth mapping processes can be used in a process including both structural and functional approaches.

While the above description contains many specific embodiments of the invention, these should not be construed as limitations on the scope of the invention, but rather as examples of specific embodiments thereof. Accordingly, the scope of the invention should be determined not by the embodiments illustrated, but by the appended claims and their equivalents.

What is claimed is:

1. A method for mapping state elements for equivalence verification between a first circuit and a second circuit, the method comprising:
   (a) determining, using a computer, a first sequential depth from primary inputs and primary outputs of the first circuit and the second circuit to each state element of the first and second circuits, wherein the first sequential depth is a minimum count of state elements along any path between two points of a circuit;
   (b) identifying and mapping first state elements of the first circuit and the second circuit having a unique first sequential depth;
   (c) determining a second sequential depth from the identified first state elements of the first circuit and the second circuit to the remaining state elements;
   (d) identifying and mapping second state elements of the first circuit and the second circuit having a unique second sequential depth; and
   (e) repeating (c) and (d) unless the method is no longer generating new unique mappings of state elements.

2. The method of claim 1, wherein the determining the first sequential depth from primary inputs and primary outputs of the first circuit and the second circuit to the state elements comprises:
   determining the first sequential depth from each of the primary inputs and primary outputs of the first circuit to each of the state elements of the first circuit; and
   determining the first sequential depth from the primary inputs and primary outputs to each of the state elements of the second circuit.

3. The method of claim 1, wherein the identifying and mapping the first state elements of the first circuit and the second circuit having the unique first sequential depth comprises:
   grouping state elements of the first circuit having identical first sequential depth;
   selecting the first state elements of the first circuit having a group count of one;
   grouping state elements of the second circuit having identical first sequential depth;
   selecting the first state elements of the second circuit having a group count of one; and
   mapping the selected first state elements of the first circuit to the selected first state elements of the second circuit if the selected first state elements of the first circuit and second circuit have about identical first sequential depth.

4. The method of claim 1, wherein the determining the second sequential depth from the identified first state elements for the first circuit and the second circuit to the remaining state elements comprises:
   determining the second sequential depth from each of the identified first state elements of the first circuit to each of the remaining state elements of the first circuit; and
   determining the second sequential depth from each of the identified first state elements of the second circuit to each of the remaining state elements of the second circuit.

5. The method of claim 1, wherein the identifying and mapping second state elements of the first circuit and the second circuit having the unique second sequential depth comprises:
   grouping state elements of the first circuit having identical second sequential depth;
   selecting the second state elements of the first circuit having a group count of one;
   grouping state elements of the second circuit having identical second sequential depth;
   selecting the second state elements of the second circuit having a group count of one; and
   mapping the selected second state elements of the first circuit to the selected second state elements of the second circuit if the selected second state elements of the first circuit and second circuit have about identical second sequential depth.

6. The method of claim 1, wherein the repeating (c) and (d) unless the method is no longer generating new unique mappings of state elements comprises repeating (c) and (d) until successive iterations of (c) and (d) do not generate new unique mappings of state elements.

7. The method of claim 1:
   wherein the determining the first sequential depth from primary inputs and primary outputs of the first circuit and the second circuit to the state elements comprises:
      determining the first sequential depth from each of the primary inputs and primary outputs of the first circuit to each of the state elements of the first circuit; and
      determining the first sequential depth from the primary inputs and primary outputs to each of the state elements of the second circuit;
   wherein the identifying and mapping the first state elements of the first circuit and the second circuit having the unique first sequential depth comprises:
      grouping state elements of the first circuit having identical first sequential depth;
      selecting the first state elements of the first circuit having a group count of one;
      grouping state elements of the second circuit having identical first sequential depth;
      selecting the first state elements of the second circuit having a group count of one; and
      mapping the selected first state elements of the first circuit to the selected first state elements of the second circuit if the selected first state elements of the first circuit and second circuit have about identical first sequential depth.

8. The method of claim 7:
   wherein the determining the second sequential depth from the identified first state elements for the first circuit and the second circuit to the remaining state elements comprises:
      determining the second sequential depth from each of the identified first state elements of the first circuit to each of the remaining state elements of the first circuit; and
      determining the second sequential depth from each of the identified first state elements of the second circuit to each of the remaining state elements of the second circuit;
   wherein the identifying and mapping second state elements of the first circuit and the second circuit having the unique second sequential depth comprises:
      grouping state elements of the first circuit having identical second sequential depth;
      selecting the second state elements of the first circuit having a group count of one;
      grouping state elements of the second circuit having identical second sequential depth;
      selecting the second state elements of the second circuit having a group count of one; and
      mapping the selected second state elements of the first circuit to the selected second state elements of the second circuit if the selected second state elements of the first circuit and second circuit have about identical second sequential depth, wherein the repeating (c) and (d) unless the method is no longer generating new unique mappings of state elements comprises repeating (c) and (d) until successive iterations of (c) and (d) do not generate new unique mappings of state elements.

9. A method for mapping state elements for equivalence verification between a first circuit and a second circuit, the method comprising:
(a) determining, using a computer, a first sequential depth from primary inputs and primary outputs of the first circuit and the second circuit to each state element of the first and second circuits, wherein the first sequential depth is a minimum count of state elements along any path between two points of a circuit;
(b) generating a first feature vector for each state element of the first circuit and the second circuit based on the first sequential depth for the each state element;
(c) identifying state elements of the first circuit and the second circuit having unique first vectors, and mapping the identified state elements of the first circuit to the identified state elements of the second circuit if the first feature vectors of the identified state elements of the first and second circuits are about identical;
(d) determining a second sequential depth from the identified first state elements of the first circuit and the second circuit to the remaining state elements;
(e) generating a second feature vector for each identified state element of the first circuit and the second circuit based on the second sequential depth for the each identified state element;
(f) identifying state elements of the first circuit and the second circuit having unique second vectors, and mapping the identified state elements of the first circuit having unique second vectors to the identified state elements of the second circuit having unique second vectors if the second feature vectors of the identified state elements of the first and second circuits having unique second vectors are about identical; and
(g) determining whether a threshold condition for completion of the mapping method is satisfied.

10. The method of claim 9, wherein the determining whether the threshold condition for completion of the mapping method is satisfied comprises:
repeating (d)-(f) until the threshold condition for completion of the mapping method is satisfied.

11. The method of claim 10, wherein the repeating (d)-(f) until the threshold condition for completion of the mapping method is satisfied comprises:
repeating (d)-(f) until successive iterations of (d)-(f) do not generate new unique mappings of state elements.

12. The method of claim 9, wherein the determining the first sequential depth for primary inputs and primary outputs of the first circuit and the second circuit comprises:
determining the first sequential depth to each of the state elements of the first circuit from each of the primary inputs and primary outputs of the first circuit; and
determining the first sequential depth to each of the state elements of the second circuit from each of the primary inputs and primary outputs of the second circuit.

13. The method of claim 9, wherein the identifying the state elements of the first circuit and the second circuit having the unique first vectors and mapping the identified state elements comprises:
grouping state elements of the first circuit having about identical first vectors;
selecting the first state elements of the first circuit having a group count of one;
grouping state elements of the second circuit having about identical first vectors;
selecting the first state elements of the second circuit having a group count of one; and
mapping the selected state elements of the first circuit to the selected state elements of the second circuit if the first feature vectors of the selected state elements of the first and second circuits are about identical.

14. The method of claim 13, wherein mapping the selected state elements of the first circuit to the selected state elements of the second circuit if the first feature vectors of the selected state elements of the first and second circuits are about identical comprises using a distance algorithm to resolve minor differences between second vectors of the first circuit and second vectors of the second circuit.

15. The method of claim 14, wherein the distance algorithm comprises an algorithm selected from the group consisting of a Euclidean distance algorithm, a Manhattan distance algorithm, and a Hamming distance algorithm.

16. The method of claim 9, wherein the determining the second sequential depth for the identified first state elements of the first circuit and the second circuit to remaining state elements comprises:
determining the second sequential depth to each of the remaining state elements of the first circuit from each of the identified state elements of the first circuit; and
determining the second sequential depth to each of the remaining state elements of the second circuit from each of the identified state elements of the second circuit.

17. The method of claim 9, wherein the identifying state elements of the first circuit and the second circuit having the unique second vectors and mapping the identified state elements comprises:
grouping state elements of the first circuit having about identical second vectors;
selecting the state elements of the first circuit having a group count of one;
grouping state elements of the second circuit having about identical second vectors;
selecting the state elements of the second circuit having a group count of one; and
mapping the selected state elements of the first circuit having unique second vectors to the selected state elements of the second circuit having unique second vectors if the second feature vectors of the selected state elements of the first and second circuits having unique second vectors are about identical.

18. The method of claim 17, wherein the mapping the selected state elements of the first circuit having unique second vectors to the selected state elements of the second circuit having unique second vectors if the second feature vectors of the selected state elements of the first and second circuits having unique second vectors are about identical comprises using a distance algorithm to resolve minor differences between second vectors of the first circuit and second vectors of the second circuit.

19. The method of claim 18, wherein the distance algorithm comprises an algorithm selected from the group consisting of a Euclidean distance algorithm, a Manhattan distance algorithm, and a Hamming distance algorithm.

* * * * *